(12) United States Patent
Chikara

(10) Patent No.: US 11,661,495 B2
(45) Date of Patent: May 30, 2023

(54) ORGANIC BOARD, METAL-CLAD LAMINATE, AND WIRING BOARD

(71) Applicant: KYOCERA Corporation, Kyoto (JP)

(72) Inventor: Chie Chikara, Kyotanabe (JP)

(73) Assignee: KYOCERA Corporation, Kyoto (JP)

( * ) Notice: Subject to any disclaimer, the term of this patent is extended or adjusted under 35 U.S.C. 154(b) by 70 days.

(21) Appl. No.: 17/255,473

(22) PCT Filed: Jun. 20, 2019

(86) PCT No.: PCT/JP2019/024513
§ 371 (c)(1),
(2) Date: Dec. 23, 2020

(87) PCT Pub. No.: WO2020/004225
PCT Pub. Date: Jan. 2, 2020

(65) Prior Publication Data
US 2021/0214523 A1    Jul. 15, 2021

(30) Foreign Application Priority Data
Jun. 26, 2018    (JP) .............................. JP2018-121237

(51) Int. Cl.
*B32B 3/10*    (2006.01)
*C08K 5/03*    (2006.01)
(Continued)

(52) U.S. Cl.
CPC .............. *C08K 5/03* (2013.01); *B32B 15/085* (2013.01); *B32B 15/20* (2013.01); *B32B 27/20* (2013.01);
(Continued)

(58) Field of Classification Search
None
See application file for complete search history.

(56) References Cited

U.S. PATENT DOCUMENTS

| 2003/0044588 A1 | 3/2003 | Komoto et al. |
| 2018/0051170 A1* | 2/2018 | Chikara .................. B32B 15/08 |
| 2019/0160785 A1 | 5/2019 | Komatsu et al. |
| 2020/0077514 A1 | 3/2020 | Nagasawa et al. |

FOREIGN PATENT DOCUMENTS

| CN | 1386131 A | 12/2002 |
| CN | 101220160 A | 7/2008 |

(Continued)

OTHER PUBLICATIONS

Machine translation of JP-2004277726-A (Year: 2004).*

*Primary Examiner* — Christopher M Polley
(74) *Attorney, Agent, or Firm* — Volpe Koenig

(57) ABSTRACT

An organic board of the present disclosure has a resin component comprising at least one resin selected from the group consisting of an epoxy resin, a polyimide resin, a phenolic resin, an amino resin, a polyester resin, a polyphenylene resin, a cyclic olefin resin, and a Teflon (registered trademark) resin as the main component, and a non-resin component including at least one of an inorganic filler and a flame retardant, in which the non-resin component is dispersed in the resin component, at least a part of the non-resin component is agglomerated to form an aggregate, a part of the resin component forms a resin material part having a particle shape, the resin material part exists within the aggregate, or the resin component forms a matrix phase surrounding the aggregate, and there are voids at some interfaces between the resin component and the aggregate.

7 Claims, 1 Drawing Sheet

(51) Int. Cl.
  *B32B 15/085* (2006.01)
  *B32B 15/20* (2006.01)
  *B32B 27/20* (2006.01)
  *B32B 27/32* (2006.01)
  *C08K 3/36* (2006.01)
  *H05K 1/03* (2006.01)

(52) U.S. Cl.
  CPC ............. *B32B 27/325* (2013.01); *C08K 3/36* (2013.01); *H05K 1/0373* (2013.01); *B32B 2250/03* (2013.01); *B32B 2250/40* (2013.01); *B32B 2264/1021* (2020.08); *B32B 2307/3065* (2013.01); *B32B 2457/08* (2013.01); *H05K 2201/012* (2013.01)

(56) References Cited

FOREIGN PATENT DOCUMENTS

| | | | |
|---|---|---|---|
| EP | 3648116 A1 | 5/2020 | |
| EP | 3817527 A1 | 5/2021 | |
| JP | 2004-277726 A | 10/2004 | |
| JP | 2004277726 A * | 10/2004 | |
| JP | 2010-100843 A | 5/2010 | |
| JP | 2017-132858 A | 8/2017 | |
| JP | 2018-039950 A | 3/2018 | |
| WO | 2009/038177 A1 | 3/2009 | |
| WO | 2013/030998 A1 | 3/2013 | |
| WO | 2016/093248 A1 | 6/2016 | |
| WO | 2016/147984 A1 | 9/2016 | |
| WO | WO-2016147984 A1 * | 9/2016 | ............. B32B 15/08 |
| WO | 2018-008450 A1 | 1/2018 | |
| WO | 2018/016527 A1 | 1/2018 | |

\* cited by examiner

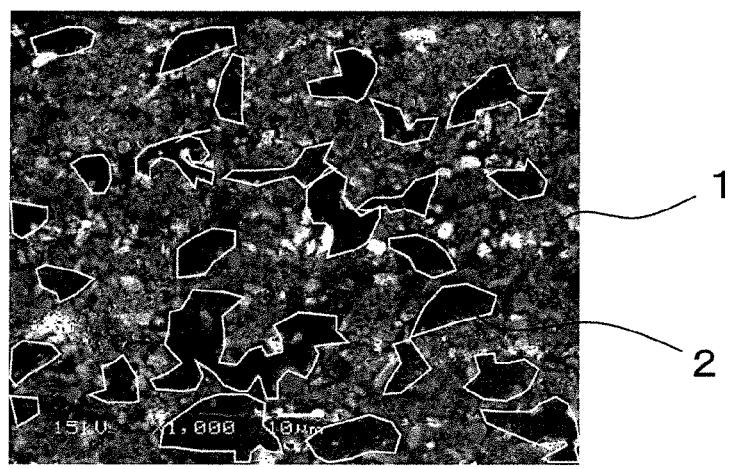

ORGANIC BOARD, METAL-CLAD LAMINATE, AND WIRING BOARD

TECHNICAL FIELD

The present disclosure relates to an organic board, a metal-clad laminate, and a wiring board.

BACKGROUND ART

In recent years, as the speed and integration of LSIs and the memory capacity have increased, the various electronic components have been rapidly reduced in size, weight, and thickness. Conventionally, cyclic olefin copolymers such as those described in Patent Document 1 are used as an insulating material in wiring boards used in the field of such electronic components. Such an insulating material is used, for example, as a copper-clad board with a copper foil bonded to its surface.

PRIOR ART DOCUMENTS

Patent Documents

Patent Document 1: Japanese Unexamined Patent Publication No. 2010-100843

SUMMARY OF THE INVENTION

The organic board of the present disclosure has a resin component including at least one resin selected from the group consisting of an epoxy resin, a polyimide resin, a phenolic resin, an amino resin, a polyester resin, a polyphenylene resin, a cyclic olefin resin, and a Teflon (registered trademark) resin as the main component, and a non-resin component including at least one of an inorganic filler and a flame retardant, wherein the non-resin component is dispersed in the resin component, at least a part of the non-resin component is agglomerated to form an aggregate, a part of the resin component forms a resin material part having a particle shape, the resin material part exists within the aggregate or the resin component forms a matrix phase surrounding the aggregate, and there are voids at some interfaces between the resin component and the aggregate.

The metal-clad laminate of the present disclosure includes the above organic board and a metal foil laminated on at least one side of the organic board.

The wiring board of the present disclosure comprises a plurality of insulating layers and a conductor layer disposed between the insulating layers, in which the insulating layers are configured by the above organic board.

BRIEF DESCRIPTION OF THE DRAWINGS

FIG. 1 is a scanning electron micrograph showing an internal structure of the organic board for an embodiment of the present disclosure.

EMBODIMENTS FOR CARRYING OUT THE INVENTION

A board formed with a conventional insulating material, such as the one described in Patent Document 1, is prone to cracking and breaking when bent, for example, and is low in strength against deformation. As described above, the organic board of the present disclosure has a resin component including at least one resin selected from the group consisting of an epoxy resin, a polyimide resin, a phenolic resin, an amino resin, a polyester resin, a polyphenylene resin, a cyclic olefin resin, and a Teflon (registered trademark) resin as the main component and a non-resin component including at least one of an inorganic filler and a flame retardant. The non-resin component is dispersed in the resin component and at least a part of the non-resin component is agglomerated to form an aggregate. A part of the resin component forms a resin material part having a particle shape, and the resin material part having a particle shape exists within the aggregate of the non-resin component. Therefore, the organic board of the present disclosure tends to shift between the resin material part and the aggregate including the non-resin component (boundary surface) because the resin material part having a particle shape exists within the aggregate of the non-resin component. Alternatively, the resin component forms a matrix phase surrounding the aggregate and has a structure in which voids exist at some interfaces between the resin component and the aggregate. This case also has a tendency to shift between the resin component and the aggregate (boundary surface). As a result, the organic board of the present disclosure has excellent flexibility and exhibits resistance to cracking and chipping even when deformed.

The organic board of the present disclosure has a resin component including at least one resin selected from the group consisting of an epoxy resin, a polyimide resin, a phenolic resin, an amino resin, a polyester resin, a polyphenylene resin, a cyclic olefin resin, and a Teflon (registered trademark) resin (hereinafter, may be referred to as "specific resin") as the main component and a non-resin component including at least one of an inorganic filler and a flame retardant.

"Including a specific resin as the main component" means that the above-mentioned specific resin is contained in the largest amount in the resin component.

Among the specific resins, the amino resin is obtained by the polycondensation of compounds having amino groups with aldehydes. Compounds having amino groups include, for example, urea, melamine or the like, and aldehydes include, for example, formaldehyde. Specifically, the amino resin includes urea resin, melamine resin or the like.

Among the specific resins, the cyclic olefin resin is a polyolefin polymer having a cyclic structure, and includes, for example, a copolymer of a cyclic olefin and other monomer that can be copolymerized with the cyclic olefin. The ratio of the cyclic olefin to the other monomer is not limited, and, for example, the cyclic olefin may contain 10 to 80% by mass and the other monomer may contain 20 to 90% by mass.

The cyclic olefin includes, for example, norbornene monomer, cyclic diene monomer, and vinyl alicyclic hydrocarbon monomer. Specifically, the cyclic olefin includes norbornene, vinyl norbornene, phenylnorbornene, dicyclopentadiene, tetracyclododecene, cyclopropene, cyclobutene, cyclopentene, cyclohexene, cyclohexadiene, and cyclooctadiene. These cyclic olefins may be used alone or in combination with two or more.

Other monomer that can be copolymerized with the cyclic olefin include, for example, chain olefins, methacrylic acid, acrylic acid esters, methacrylate esters, aromatic vinyl compounds, unsaturated nitriles, and aliphatic conjugated dienes. Specifically, such monomers include ethylene, propylene, butene, acrylic acid, methacrylic acid, fumaric acid, fumaric anhydride, maleic acid, maleic anhydride, methyl acrylate, ethyl acrylate, propyl acrylate, isopropyl acrylate, methyl methacrylate, ethyl methacrylate, propyl methacrylate, isopropyl methacrylate, styrene, vinyl toluene, acrylonitrile, methacrylonitrile, 1,3-butadiene, 2-methyl-1,3 butadiene, and 2,3-dimethyl-1,3-butadiene. These other monomers may be used alone or in combination with two or more.

The specific resin may be used appropriately, depending on the use of the organic board of the present disclosure. For example, if better electrical properties are required of the organic board of the present disclosure, at least one resin selected from the group consisting of an epoxy resin, a polyphenylene resin, a cyclic olefin resin and a Teflon (registered trademark) resin may be used as the specific resin. On the other hand, if better heat resistance and mechanical strength are required of the organic board of the present disclosure, at least one resin selected from the group consisting of an epoxy resin, a polyimide resin, a phenolic resin, an amino resin (such as a urea resin and a melamine resin), a polyphenylene resin, a cyclic olefin resin, and a Teflon (registered trademark) resin may be used as the specific resin.

In the organic board of the present disclosure, the non-resin component includes at least one of an inorganic filler and a flame retardant. The inorganic filler is not particularly limited, and includes, for example, silica, talc, mica, clay, calcium carbonate, titanium dioxide, barium titanate, carbon black, glass beads, and glass hollow spheres. For example, the silica includes crushed silica and fused silica, and may be used alone or in a mixture of two or more types. The mean particle diameter of the inorganic filler is not particularly limited and may be, for example, 0.01 μm or more and 10 μm or less, and may be 0.5 μm or more and 3 μm or less. Thus, the inorganic filler with a small mean particle diameter tends to agglomerate, and more clearly distinguishes the area of the non-resin component from the area of the resin material part having a particle shape, described later. As a result, the organic board with better flexibility and less cracking and chipping can be obtained.

The flame retardants are not limited, such as, melamine phosphate, melam polyphosphate, melem polyphosphate, melamine pyrophosphate, ammonium polyphosphate, red phosphorus, aromatic phosphate ester, phosphonic acid ester, phosphinic acid esters, phosphine oxides, phosphazene, melamine cyanolates, ethylene bis-pentabromobenzene, and ethylene bistetabromophthalimide. These flame retardants may be used alone or in combination with two or more. In this case, a brominated flame retardant (such as ethylene bis-pentabromobenzene or ethylene bis-tetrabromophthalimide) may be used in view of the fact that the dielectric dissipation factor of the organic board can be lowered. The mean particle diameter of the flame retardant is not particularly limited, and may be, for example, 0.01 μm or more and 10 μm or less, and may be 0.5 μm or more and 3 μm or less. The flame retardant with a small mean particle diameter tends to agglomerate and more clearly distinguishes the area of the non-resin component from the area of the resin material part having a particle shape, described later. As a result, the organic board having better flexibility and resistance to cracking and chipping is obtained.

FIG. 1 is a scanning electron micrograph showing the internal structure of the organic board for one embodiment of the present disclosure. In FIG. 1, the reference number 1 is the aggregate part. The reference number 2 is the resin material part. The resin material part 2 is the area surrounded by a white line in FIG. 1.

The aggregate 1 forms a structure in which the non-resin component is dispersed in the resin component and at least a part of the non-resin component is agglomerated. The resin material part 2 is a part where the part of the resin components is in particle shape. The resin material part 2, which forms a particle shape, exists in the aggregate 1.

The resin material part 2 refers to the resin component that has a particle shape and exists within the aggregate 1, among the resin components. This means that the resin material part 2 exists in the aggregate 1, which has a larger area (volume) than the resin material part 2. However, the resin material part 2 does not need to be formed solely of the resin component, and the resin component may occupy at least 90% of the area of the resin material part 2, for example, when the resin material part 2 is viewed in cross section. Other components included in the resin material part 2 may be, for example, non-resin components such as an inorganic filler and particles of a flame retardant.

The shape of the resin material part 2 is not particularly limited. The resin material part 2 may have a shape with an aspect ratio of 2 or less, for example, when the organic board is viewed in cross section. Not all of the resin material parts 2 need to have such a shape, and at least 60% of the total number of the resin material parts 2 included in the organic board may have an aspect ratio of 2 or less out of the total number of the resin material parts 2. In this case, the aspect ratio means the ratio of the longest diameter of the resin material part 2 measured in cross-sectional view of the organic board to the shortest diameter in the direction perpendicular to the direction in which the longest diameter is measured (longest diameter/shortest diameter).

The mean particle diameter of the resin material part 2 is not particularly limited. The resin material part 2 may have a larger mean particle diameter than the mean particle diameter of the inorganic filler and the flame retardant, for example. In terms of enhancing the flexibility of the organic board, the resin material part 2 may have a mean particle diameter of 10 μm or more and 20 μm or less. This is because when the mean particle diameter of the resin material part 2 is 10 μm or more and 20 μm or less, there is a tendency for a shift to occur between the resin material part 2 and the aggregate 1 (the boundary surface), and the aggregate 1 that is the skeleton is easily deformed.

In terms of enhancing the flexibility of the organic board, the resin material part 2 may occupy an area of 6% or more and 30% or less when the organic board is viewed in cross section, and in particular, it may occupy an area of 8% or more and 25% or less. In terms of further improving the heat resistance of the organic board, the resin material part 2 may occupy an area of 6% or more and 25% or less. When the organic board is used as a material for the metal-clad laminate, the resin material part 2 may occupy an area of 8% or more and 30% or less in terms of lowering the dielectric dissipation factor of the resulting metal-clad laminate and increasing the adhesive strength between the metal foil and the organic board.

The identification of the aggregate 1 and the resin material part 2 is performed, for example, by the following procedure. First, the organic board is cut to a predetermined size (for example, 0.5 mm×0.5 mm). The identification of the aggregate 1 and the resin material part 2 can be performed by the same method for the metal-clad laminate and the wiring board using the organic board instead of the organic board. The cross section of the cut organic board is then observed with the scanning electron microscope and photographed as shown in FIG. 1. A digital microscope may be used instead of the scanning electron microscope. For example, the range for photography is about 100 to 150 μm in height and 100 to 150 μm in width. Any part of the photo may be taken in only one location.

Based on the photos taken, the aggregate 1 and the resin material part 2 are then identified. In the case of scanning electron micrographs, the resin component, the inorganic filler and the flame retardant are identified by an analyzer (electron probe microanalyzer (EPMA)) attached to the scanning electron microscope. In this case, the inorganic filler and the flame retardant are identified from the included inorganic elements (for example, Si and Br). The resin component is the part of the resin that does not include the above elements in the inorganic filler and the flame retardant. The identification of the resin component, the inorganic filler and the flame retardant can also be distinguished from each other based on the differences in coloration that appear in the photographs, after identifying the elements. Thus, the parts of the photograph that are similar in color to the identified resin component, inorganic filler and flame retardant are identified as the resin component, the inorganic filler and the flame retardant, respectively. For example, in the picture shown in FIG. 1, the black area is the resin component, the white area is the inorganic filler, and the gray area is the flame retardant. In this case, the resin material part having a part of the resin component in a particle shape shows a black color because the majority is made up of the resin component.

When the aggregate 1 and the resin material part 2 are in a state where they are intertwined at an adjacent interface, the interfaces between the aggregate 1 and the resin material part 2 are uneven with each other. When the aggregate 1 and the resin material part 2 form such unevenness, the respective areas of the aggregate 1 and the resin material part 2 are defined by the following method.

For example, a smooth line is drawn around the outline of the black area where the interface is uneven, and a smooth line is drawn connecting approximately ½ of the normal direction of the outline that forms the unevenness. The range of this smooth line is defined as the resin material part 2. The remainder basically corresponds to the area of the aggregate 1. The aggregate 1 also includes the resin component, which is agglomerated with the non-resin component. In this way, the area of the resin material part 2 and the aggregate 1 can be determined by identifying the area of each.

In order that the non-resin component, which includes the resin material part 2 and the aggregate 1, has the area ratio as described above, the non-resin component may be used in a ratio of, for example, 100 to 160 parts by mass of the resin component to 100 parts by mass of the resin component. When the inorganic filler and the flame retardant are used together, it is sufficient to use, for example, in a ratio of 50 to 80 parts by mass of the inorganic filler and 50 to 80 parts by mass of the flame retardant to 100 parts by mass of the resin component.

According to the organic board of the present disclosure, the resin component may form a matrix phase surrounding the aggregate. In this case, it is preferable to have a structure in which the voids exist at some interfaces between the resin component and the aggregate. Due to the voids at some interfaces between the resin component and the aggregate, they tend to shift between the resin component and the aggregate (boundary surface). The matrix phase in which the resin component surrounds the aggregate refers to a medium-like state in which the resin component exists in a uniform structure around the aggregate.

A structure in which the resin component forms a matrix phase surrounding the aggregate and the voids exist at some interfaces between the resin component and the aggregate is likely to be formed when the resin component is at least one selected from the group of an epoxy resin, a polyphenylene resin, a polyimide resin, a phenolic resin, an amino resin, a polyester resin and a Teflon (registered trademark) resin. The voids between the resin component and the aggregate mean the area that is in a part of the outline of the aggregate and not in contact with the resin component.

The ratio of the voids should be 5% or more and 60% or less when the length of the outline of the aggregate is 100. When the ratio of the voids is in the above range, the organic board has a mechanical strength above a predetermined level as a wiring board. The direction of the length of the void is the direction along its outline. Furthermore, there may be a part that is also absent of the resin component inside the aggregate.

The organic board of the present disclosure may further include a stress reliever. The stress reliever is not particularly limited, and is, for example, a silicone resin particle or the like. The silicone resin particle includes, for example, KMP-597 (Shin-Etsu Chemical Co., Ltd.) and X-52-875 (Shin-Etsu Chemical Co., Ltd.) as silicone rubber powder and KMP-590 (Shin-Etsu Chemical Co., Ltd.) and X-52-1621 (Shin-Etsu Chemical Co., Ltd.) as a silicone resin powder. These stress relievers may be used alone or in combination with two or more.

The stress reliever may have a mean particle diameter of 10 μm or less. By using the stress reliever having such a mean particle diameter, when the organic board is used, for example, in the metal-clad laminate, the adhesion with the metal foil can be improved. The stress reliever is included in a ratio of, for example, 1 to 10 parts by mass, when the total amount of the resin component and the non-resin component is 100 parts by mass.

The methods of producing the organic board of the present disclosure are not particularly limited. For example, it is obtained by mixing and molding the resin component including a specific resin as the main component and the non-resin component including at least one of the inorganic filler and the flame retardant, and then pressurizing and heat-treating the mixture. The mixing method of the resin component and the non-resin component is not particularly limited, and includes, for example, a solution mixing method in which all components are uniformly dissolved or dispersed in a solvent, and a melt-blending method in which all components are heated by an extruder.

Xylene, for example, can be used as a solvent in the solution mixing method. In this case, the mass ratio of the solids (resin component and non-resin component) to the solvent is not particularly limited but is mixed in the mass ratio of about 60:40 to 20:80, for example. In addition to xylene, aromatic solvents such as toluene, benzene, and ethylbenzene, hydrocarbon solvents such as normal-hexane, cyclohexane, and methylcyclohexane, ketone solvents such as acetone, and other solvents such as tetrahydrofuran and chloroform may be used, or xylene may be used in combination with the other solvents mentioned above. By mixing the resin component, the non-resin component and the solvent in this manner, a resin varnish is obtained.

A sheet-like molded body is then made from the obtained resin varnish. Specifically, the resin varnish is formed into a sheet form by a bar coater method, a doctor blade method, a die coater method, an extrusion method, and an injection molding method, and then dried for 1 to 10 minutes at 120 to 150° C. to obtain an uncured sheet-like molded body. The organic board is obtained by submitting the sheet-like molded body to pressurized heat treatment. The conditions for the pressurized heat treatment are, for example, a temperature of 160 to 230° C. and a pressure of 1 to 10 MPa. The organic board thus obtained has a thickness of, for example, 0.01 to 1 mm.

Next, the metal-clad laminate of the present disclosure is described. The metal-clad laminate of the present disclosure has a metal foil on at least one side of the organic board of the present disclosure. The metal-clad laminate using the organic board of the present disclosure can increase the adhesive strength between the metal foil and the organic board, because the resin material part having a particle shape exists within the aggregate of the non-resin component. The metal-clad laminate of the present disclosure is obtained, for example, by overlapping the above-mentioned sheet-like molded body and the metal foil and then heating (curing) and press-molding it. The metal foil is not particularly limited, and includes, for example, a copper foil such as an electrolytic copper foil or a rolled copper foil, an aluminum foil, or a composite foil made by overlapping these metal foils. Among these metal foils, a copper foil, for example, is used. The thickness of the metal foil is not particularly limited, and is, for example, from 5 to 105 μm. The metal-clad laminate of the present disclosure can be obtained by overlapping a desired number of the above-mentioned sheet-like molded body and the metal foil, respectively, and heating and press-molding them. The metal-clad laminate of the present disclosure has, for example, a dielectric dissipation factor of 0.0017 or less. Thus, if the dielectric dissipation factor of the metal-clad laminate is 0.0017 or less, sufficient electrical properties such as an excellent permittivity are demonstrated. The metal-clad laminate of the present disclosure is used for a printed wiring board, for example.

Next the wiring board of the present disclosure is described. The wiring board of the present disclosure comprises a plurality of insulating layers and a conductor layer disposed between the insulating layers, in which the insulating layers are formed with the organic board of the present disclosure. The wiring board of the present disclosure is obtained, for example, by overlapping an inner layer board, on which circuits and through holes are formed on a metal-clad laminate of the present disclosure, and a prepreg, laminating a metal foil on the surface of the prepreg, and then heating (curing) and press-molding the board. In addition, the circuits and the through holes may be formed on the surface of the metal foil to make a multilayered printed wiring board.

As described above, the organic board of the present disclosure has excellent flexibility and resistance to cracking and chipping even when deformed. Therefore, the metal-clad laminate and the wiring board using the organic board of the present disclosure can be mounted on electronic devices in a deformed state, for example, to improve the mounting density. Furthermore, the metal-clad laminate using the organic board of the present disclosure can increase the adhesive strength between the metal foil and the organic board because the resin material part having a particle shape exists within the aggregate of the non-resin component. The metal-clad laminate using the organic board of the present disclosure has excellent electrical properties with low relative permittivity and dielectric dissipation factor.

EXAMPLES

Embodiments of the present disclosure are described in detail with Examples below, however, the embodiments of the present disclosure are not limited to these Examples.

Example 1

As shown in Table 1, a resin varnish was prepared by mixing 70 parts by mass of silica (mean particle diameter of 1 μm) as an inorganic filler, 70 parts by mass of ethylene bis-pentabromobenzene (mean particle diameter of 1 μm, Brand Name: SAYTEX8010, manufactured by Albemarle Corporation) as a flame retardant, and xylene as a solvent in a predetermined ratio to 100 parts by mass of a thermosetting cyclic olefin copolymer (COC, manufactured by Mitsui Chemicals, Inc.).

The resulting resin varnish was then applied to a base material (polyethylene terephthalate film) using a bar coater so as to have a thickness of about 120 μm. After application on the base material, it was dried at 150° C. for 4 minutes, and then peeled off from the base material to obtain an uncured sheet-like molded body (30 cm×30 cm). Two similar sheet-like molded bodies were prepared.

One of the obtained sheet-like molded bodies was then subjected to a pressurized heat treatment to obtain an organic board having a thickness of about 100 μm. The pressurized heat treatment was carried out under pressurized heat conditions of 200° C. and 4 MPa for 120 minutes. The pressurized heat treatment was carried out under pressurized heat conditions of 200° C. and 4 MPa for 120 minutes. For another single sheet-like molded body, a copper foil with a thickness of 18 μm was laminated on both sides. The sheet-like molded body on which the copper foil was laminated was subjected to pressurized heat treatment under pressurized heat conditions of 200° C. and 4 MPa, and held for 120 minutes, to obtain a copper-clad laminate.

Example 2

A resin varnish was prepared by the same procedure as in Example 1, except that 67 parts by mass of silica and 67 parts by mass of ethylene-bis pentabromobenzene were used, and two sheet-like molded bodies were prepared. An organic board and a copper-clad laminate were then obtained by the same procedure as in Example 1, except that the resulting sheet-like molded body was used.

Example 3

A resin varnish was prepared by the same procedure as in Example 1, except that 55 parts by mass of silica and 55 parts by mass of ethylene-bis pentabromobenzene were used, and two sheet-like molded bodies were prepared. An organic board and a copper-clad laminate were then obtained by the same procedure as in Example 1, except that the resulting sheet-like molded body was used.

Example 4

A resin varnish was prepared by the same procedure as in Example 1, except that 50 parts by mass of silica and 50 parts by mass of ethylene-bis pentabromobenzene were used, and two sheet-like molded bodies were prepared. An organic board and a copper-clad laminate were then obtained by the same procedure as in Example 1, except that the resulting sheet-like molded body was used.

Example 5

A resin varnish was prepared by the same procedure as in Example 1, except that a ratio of 67 parts by mass of silica and 67 parts by mass of ethylene bis-pentabromobenzene to 100 parts by mass of epoxy resin was used, and two sheet-like molded bodies were prepared by the same procedure as in Example 1. An organic board and a copper-clad laminate were then obtained by the same procedure as in Example 1, except that the resulting sheet-like molded body was used.

Example 6

As shown in Table 2, a resin varnish was prepared by the same procedure as in Example 1, except that a ratio of 67 parts by mass of silica and 67 parts by mass of ethylene bis-pentabromobenzene to 100 parts by mass of polyphenylene resin was used, and two sheet-like molded bodies were prepared. An organic board and a copper-clad laminate were then obtained by the same procedure as in Example 1, except that the resulting sheet-like molded body was used.

Examples 7 to 11

A resin varnish was prepared by the same procedure as in Example 1, except that silica was used in a ratio of 67 parts by mass to 100 parts by mass of the resin as shown in Table 2, and no flame retardant was used, and two sheet-like molded bodies were prepared by the same procedure as in Example 1. An organic board and a copper-clad laminate were then obtained by the same procedure as in Example 1, except that the resulting sheet-like molded body was used.

All the samples obtained in Examples 5 to 11 had a structure in which a resin component formed a matrix phase surrounding an aggregate and some interfaces between the resin component and the aggregate had voids. The ratio of the voids in the samples of Examples 5 to 11 was 8 to 10% when the length of the outline of the aggregate was set as 100%. Furthermore, a part that was absent of the resin component was also observed inside the aggregate.

The area ratio and the mean particle diameter of the resin material part having a particle shape were measured for the organic board obtained in the Examples. The results are shown in Table 1. In addition, the flexibility of the obtained organic board was evaluated by the following method. The values (30% and 71%) in Examples 5 to 11 of Tables 1 and 2 are the area ratio of the resin component.

<Flexibility>

The obtained organic board was cut to prepare samples (2 mm×20 mm). Stainless steel (SUS304) rods with diameters of 2 mm, 3 mm, 4 mm, 5 mm, 6 mm, and 7 mm were prepared, and the resulting samples were placed on each rod and bent at 180°. The folded area was visually observed and checked for cracks. The minimum diameters of the rods where cracks occurred are shown in Tables 1 and 2. Flexibility was judged to be excellent when the diameter was 6 mm or less, and particularly excellent for flexibility when the diameter was 4 mm or less.

The relative permittivity and the dielectric dissipation factor of the obtained copper-clad laminate were measured by the balanced-type circular disk resonator method at a frequency of 30 GHz. Furthermore, the peel strength and the heat resistance of the obtained organic board were evaluated by the following method.

The obtained copper-clad laminate was cut to prepare samples (3 mm×30 mm). The copper foil of the obtained sample was pulled perpendicular to the board at a speed of 50 mm per minute, and the strength of the copper foil when it peeled off from the board (peel strength) was measured by autograph. The results are shown in Tables 1 and 2.

<Heat Resistance>

The obtained copper-clad laminate was cut to prepare samples (2 mm×2 mm). The obtained samples were immersed in a solder bath heated to 290° C. for 3 minutes. After heating, the samples were visually checked for swelling. The results are shown in Tables 1 and 2. If there was even one swelling, it was rated as "with swelling" (poor).

TABLE 1

| | Example 1 | Example 2 | Example 3 | Example 4 | Example 5 |
|---|---|---|---|---|---|
| Flame Retardant: Ethylene Bis-Pentabromobenzene | | | | | |
| Resin | COC | COC | COC | COC | Epoxy Resin |
| (Parts by Mass) | (100) | (100) | (100) | (100) | (100) |
| Inorganic Filler | Silica | Silica | Silica | Silica | Silica |
| (Parts by Mass) | (70) | (67) | (55) | (50) | (67) |
| Flame Retardant (Parts by Mass) | 70 | 67 | 55 | 50 | 67 |
| Resin Material Part or Area Ratio of Resin Component | 6% | 8% | 25% | 30% | (30%) |
| Form of Resin Component | Particle Shape | Particle Shape | Particle Shape | Particle Shape | Matrix Phase |
| Mean Particle Diameter of Resin Component | 18 μm | 16 μm | 14 μm | 10 μm | |
| Flexibility Test | 4 mm | 4 mm | 3 mm | 2 mm | 5 mm |
| Relative Permittivity (Dk) | 2.7 | 2.7 | 2.7 | 2.7 | 3.5 |
| Dielectric Dissipation Factor (Df) | 0.0014 | 0.0013 | 0.0012 | 0.0011 | 0.0040 |
| Peel Strength | 0.69 KN/m | 0.70 KN/m | 0.87 KN/m | 0.83 KN/m | 0.80 KN/m |
| Heat Resistance | OK (Without Swelling) | OK (Without Swelling) | OK (Without Swelling) | NG (With Swelling) | OK (Without Swelling) |

TABLE 2

Flame Retardant: Ethylene Bis-Pentabromobenzene

|  | Example 6 | Example 7 | Example 8 | Example 9 | Example 10 | Example 11 |
|---|---|---|---|---|---|---|
| Resin (Parts by Mass) | Polyphenylene Resin (100) | Polyimide Resin (100) | Phenol Resin (100) | Amino Resin (100) | Polyester Resin (100) | Teflon Resin (100) |
| Inorganic Filler (Parts by Mass) | Silica (67) | Silica (67) | Silica (67) | Silica (67) | Silica (67) | Silica (67) |
| Flame Retardant (Parts by Mass) | 67 | — | — | — | — | — |
| Resin Material Part or Area Ratio of Resin Component | (30%) | (71%) | (71%) | (71%) | (71%) | (71%) |
| Form of Resin Component | Matrix Phase | Matrix Phase | Matrix Phase | Matrix Phase | Matrix Phase | Matrix Phase |
| Mean Particle Diameter of Resin Component | — | — | — | — | — | — |
| Flexibility Test | 5 mm | 6 mm | 6 mm | 6 mm | 6 mm | 3 mm |
| Relative Permittivity (Dk) | 3 | 3.2 | 4.5 | 7.2 | 5.3 | 2.9 |
| Dielectric Dissipation Factor (Df) | 0.0033 | 0.007 | 0.015 | 0.045 | 0.008 | 0.0009 |
| Peel Strength | 0.60 KN/m | — | — | — | — | 0.49 KN/m |
| Heat Resistance | OK (Without Swelling) | OK (Without Swelling) | OK (Without Swelling) | OK (Without Swelling) | NG (With Swelling) | OK (Without Swelling) |

As shown in Tables 1 and 2, in the organic board obtained in Examples 1 to 11, cracks were generated in the flexibility test when rods with a diameter of 6 mm or less were used. This shows that all the organic boards obtained in Examples 1 to 11 have excellent flexibility.

In particular, in the organic boards obtained in Examples 1 to 4 and 11, cracks were generated in the flexibility test when rods with a diameter of 4 mm or less were used. Among these, the organic boards obtained in Examples 1 to 4 have particularly excellent flexibility because the resin component has a particle shape and exists within the aggregate of the non-resin component.

On the other hand, no particle-shaped resin material parts were observed in the organic boards obtained in Examples 5 to 11. The organic boards obtained in Examples 5 to 11 had a structure in which the resin component formed a matrix phase surrounding the aggregate and voids existed at some interfaces between the resin component and the aggregate. It is understood that even in the organic boards obtained in Examples 5 to 10 having such a structure, cracks are generated when rods with a diameter of 5 mm or 6 mm are used, and therefore the organic boards have excellent flexibility.

DESCRIPTION OF THE REFERENCE NUMERALS

1 Aggregate (Non-Resin Component)
2 Resin Material Part

The invention claimed is:

1. An organic board comprising:
a resin component including a main component having at least one resin selected from the group consisting of an epoxy resin, a polyimide resin, a phenolic resin, an amino resin, a polyester resin, a polyphenylene resin, and a cyclic olefin resin, and
a non-resin component including an inorganic filler and a flame retardant, the non-resin component being dispersed in the resin component, and at least a part of the non-resin component is agglomerated to form an aggregate,
wherein a ratio of the non-resin component is 100 to 160 parts by mass with respect to 100 parts by mass of the resin component,
wherein the inorganic filler is included in a ratio of 50 to 80 parts by mass when the resin component is 100 parts by mass and the flame retardant is included in a ratio of 50 to 80 parts by mass when the resin component is 100 parts by mass, and
wherein a part of the resin component forms a resin material part having a particle shape, and the resin material part exists within the aggregate, or the resin component forms a matrix phase surrounding the aggregate with voids at some interfaces between the resin component and the aggregate.

2. The organic board according to claim 1, wherein the resin material part occupies an area of 6% or more and 30% or less when viewed in cross section.

3. The organic board according to claim 1, wherein the resin material part has a larger mean particle diameter than the mean particle diameter of the inorganic filler and the flame retardant when viewed in cross section.

4. The organic board according to claim 1, wherein the inorganic filler and the flame retardant have a mean particle diameter of 0.01 μm or more and 10 μm or less when viewed in cross section.

5. A metal-clad laminate comprising the organic board according to claim 1 and a metal foil laminated on at least one side of the organic board.

6. A wiring board comprising a plurality of insulating layers and conductor layers disposed between the plurality of insulating layers, wherein the plurality of insulating layers are configured by the organic board according to claim 1.

7. An organic board comprising:
a resin component including a main component having at least one resin selected from the group consisting of an epoxy resin, a polyimide resin, a phenolic resin, an amino resin, a polyester resin, a polyphenylene resin, and a cyclic olefin resin, and
a non-resin component including an inorganic filler and a flame retardant, the non-resin component being dispersed in the resin component, and at least a part of the non-resin component is agglomerated to form an aggregate,
wherein the inorganic filler is included in a ratio of 50 to 70 parts by mass when the resin component is 100 parts by mass and the flame retardant is included in a ratio of 50 to 70 parts by mass when the resin component is 100 parts by mass, and
wherein a part of the resin component forms a resin material part having a particle shape, and the resin material part exists within the aggregate, and voids exist at some interfaces between the resin component and the aggregate.

* * * * *